US012046629B2

(12) United States Patent
Pang

(10) Patent No.: US 12,046,629 B2
(45) Date of Patent: Jul. 23, 2024

(54) SEMICONDUCTOR DEVICE WITH INCREASED ISOLATION BREAKDOWN VOLTAGE

(71) Applicant: SK keyfoundry Inc., Cheongju-si (KR)

(72) Inventor: Yon Sup Pang, Cheonan-si (KR)

(73) Assignee: SK keyfoundry Inc., Cheongju-si (KR)

( * ) Notice: Subject to any disclaimer, the term of this patent is extended or adjusted under 35 U.S.C. 154(b) by 0 days.

(21) Appl. No.: 18/358,600

(22) Filed: Jul. 25, 2023

(65) Prior Publication Data

US 2023/0369391 A1  Nov. 16, 2023

Related U.S. Application Data

(63) Continuation of application No. 17/897,528, filed on Aug. 29, 2022, now Pat. No. 11,756,992.

(30) Foreign Application Priority Data

Apr. 7, 2022  (KR) .................. 10-2022-0043176

(51) Int. Cl.
*H01L 21/762* (2006.01)
*H01L 21/8249* (2006.01)
(Continued)

(52) U.S. Cl.
CPC .... *H01L 29/0623* (2013.01); *H01L 21/76237* (2013.01); *H01L 21/8249* (2013.01);
(Continued)

(58) Field of Classification Search
CPC ........... H01L 29/0623; H01L 21/76237; H01L 21/8249; H01L 27/0623; H01L 29/66681;
(Continued)

(56) References Cited

U.S. PATENT DOCUMENTS 6,815,305 B2   11/2004   Cha
10,566,465 B2   2/2020   Pang et al.
(Continued)

FOREIGN PATENT DOCUMENTS

KR   10-2004-0026363 A   3/2004
KR   10-2019-0038717 A   4/2019
(Continued)

OTHER PUBLICATIONS

Korean Office Action issued on Sep. 13, 2023, in counterpart Korean Patent Application No. 10-2022-0043176 (7 pages in English, 7 pages in Korean).
Korean Office Action issued on Mar. 16, 2023, in counterpart Korean Patent Application No. 10-2022-0043176 (9 pages in Korean).

*Primary Examiner* — David Vu
(74) *Attorney, Agent, or Firm* — NSIP Law

(57) ABSTRACT

A semiconductor device includes a semiconductor substrate comprising a P-type lightly doped semiconductor layer; an undoped silicon layer formed on the P-type lightly doped semiconductor layer; a first deep trench isolation and a second deep trench isolation formed from an upper surface of the semiconductor substrate to the undoped silicon layer and filled with insulating films; and a first N-type highly doped buried layer formed on the undoped silicon layer, and disposed between the first deep trench isolation and the second deep trench isolation, wherein the undoped silicon layer surrounds bottoms of the first and second deep trench isolations, and has a thickness greater than a thickness of the first N-type highly doped buried layer.

15 Claims, 10 Drawing Sheets

(51) Int. Cl.
*H01L 27/06* (2006.01)
*H01L 29/06* (2006.01)
*H01L 29/66* (2006.01)
*H01L 29/78* (2006.01)

(52) U.S. Cl.
CPC .... *H01L 27/0623* (2013.01); *H01L 29/66681* (2013.01); *H01L 29/7823* (2013.01)

(58) Field of Classification Search
CPC ............... H01L 29/7823; H01L 29/086; H01L 29/1087; H01L 29/42368; H01L 29/66689; H01L 21/761; H01L 21/76224; H01L 21/76283; H01L 29/0878; H01L 29/7816; H01L 29/0649
See application file for complete search history.

(56) References Cited

U.S. PATENT DOCUMENTS

| | | |
|---|---|---|
| 10,923,603 B2 | 2/2021 | Pang et al. |
| 11,121,253 B2 | 9/2021 | Chung et al. |
| 11,532,741 B2 | 12/2022 | Shin |
| 11,581,434 B2 | 2/2023 | Chung et al. |
| 2005/0006706 A1 | 1/2005 | Stefanov et al. |
| 2005/0054157 A1 | 3/2005 | Hsu |
| 2011/0127602 A1 | 6/2011 | Mallikarjunaswamy |
| 2012/0175727 A1 | 7/2012 | Lin et al. |
| 2013/0328123 A1 | 12/2013 | Chen et al. |
| 2020/0381424 A1 | 12/2020 | Shukla et al. |

FOREIGN PATENT DOCUMENTS

| | | |
|---|---|---|
| KR | 10-2224364 B1 | 3/2021 |
| KR | 10-2022-0023097 A | 3/2022 |

-- Background Art --

-- Background Art --

-- Background Art --

SEMICONDUCTOR DEVICE WITH INCREASED ISOLATION BREAKDOWN VOLTAGE

CROSS-REFERENCE TO RELATED APPLICATION

This application is a continuation of U.S. patent application Ser. No. 17/897,528 filed on Aug. 29, 2022 which claims the benefit under 35 U.S.C. § 119 of Korean Patent Application No. 10-2022-0043176 filed on Apr. 7, 2022, in the Korean Intellectual Property Office, the entire disclosure of which is incorporated herein by reference for all purposes.

BACKGROUND

1. Field

The following description relates to a semiconductor device for minimizing process changeability and increasing an isolation breakdown voltage (in short, ISO BV).

2. Description of Related Art

A BCD (Bipolar-CMOS-DMOS) process is essential to configure various integrated circuits (ICs) that desire higher power density and operating frequency, such as an LED driver, panel bias IC, switching regulator, battery IC, audio, amplifier, and motor driver. The most common power device used in smart power technology (SPT) is a lateral DMOS (LDMOS). The major feature of the LDMOS apparatus is to maintain a high voltage and high current during operation. To expand the applicability of LDMOS devices, reliability under harsh switching conditions must be improved, a specific on resistance (Rsp) must be minimized, and a breakdown voltage (BV) must be maximized simultaneously. Meanwhile, LDMOS power devices may occupy up to 60% of the chip area, so device designers are focusing on reducing Ron and minimizing device size to increase the number of dies on the wafer.

By combining BCD process technology and deep trench isolation (DTI) technology to manufacture competitive LDMOS of BCD and DTI technology, it is necessary to reduce Rsp, minimize size, and sufficiently increase breakdown voltage. In particular, the deep trench isolation in the BCD process is widely used because it may reduce a chip size. However, when DTI is applied to BCD technology, there is a limit to increasing the isolation breakdown voltage.

SUMMARY

This Summary is provided to introduce a selection of concepts in a simplified form that are further described below in the Detailed Description. This Summary is neither intended to identify key features or essential features of the claimed subject matter, nor is it intended to be used as an aid in determining the scope of the claimed subject matter.

In a general aspect, a semiconductor device includes a semiconductor substrate comprising a P-type lightly doped semiconductor layer; an undoped silicon layer formed on the P-type lightly doped semiconductor layer; a first deep trench isolation and a second deep trench isolation formed from an upper surface of the semiconductor substrate to the undoped silicon layer and filled with insulating films; and a first N-type highly doped buried layer formed on the undoped silicon layer, and disposed between the first deep trench isolation and the second deep trench isolation, wherein the undoped silicon layer surrounds bottoms of the first and second deep trench isolations, and has a thickness greater than a thickness of the first N-type highly doped buried layer.

A first PN junction may be formed by the P-type lightly doped semiconductor layer and the first N-type highly doped buried layer, and the first PN junction may be formed in the undoped silicon layer.

The first PN junction may be formed closer to the bottoms of the first and second deep trench isolations than the first N-type highly doped buried layer.

The semiconductor device may further include a P-type epi-layer formed on the first N-type highly doped buried layer, wherein the undoped silicon layer is in direct contact with the P-type epi-layer.

The undoped silicon layer may overlap the first N-type highly doped buried layer.

The semiconductor device may further include a P-type body region and an N-type well region spaced apart from each other and formed on the first N-type highly doped buried layer; a gate polysilicon layer formed on a gate insulating layer, and formed on the P-type body region and the N-type well region; a P-type pickup region and an N-type source region formed in the P-type body region; and an N-type drain region formed in the N-type well region.

The semiconductor device may further include a channel stop region formed under the first and second deep trench isolations and disposed in the undoped silicon layer.

Each of the first and second deep trench isolations has a side wall oxide film—borophosphosilicate glass (BPSG)—air gap structure.

The semiconductor device may further include a third deep trench isolation and a fourth deep trench isolation formed from the upper surface of the semiconductor substrate to the undoped silicon layer and filled with insulating films; and a second N-type highly doped buried layer formed on the undoped silicon layer, and disposed between the third and fourth deep trench isolations, wherein the undoped silicon layer surrounds bottoms of the third and fourth deep trench isolations, and the undoped silicon layer has a resistance higher than a resistance of the P-type lightly doped semiconductor layer and has a thickness greater than a thickness of the second N-type highly doped buried layer.

A second PN junction may be formed by the P-type lightly doped semiconductor layer and the second N-type highly doped buried layer, and the second PN junction may be formed in the undoped silicon layer.

The second PN junction may be formed closer to the bottoms of the third and fourth deep trench isolations than the second N-type highly doped buried layer.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
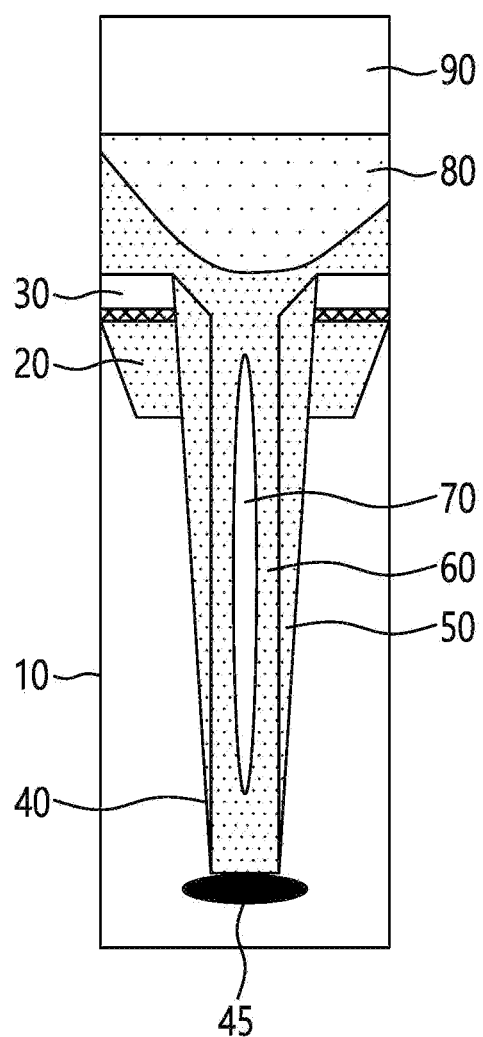
FIG. 1 illustrates a cross-sectional view of a deep trench isolation in accordance with one or more embodiments of the disclosure.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness, noting that omissions of features and their descriptions are also not intended to be admissions of their general knowledge.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

A targeted problem of the disclosure is not limited by the problems mentioned above. A person skilled in the relevant field of technology may understand other problems from the following description.

A detailed description is given below, with attached drawings.

The one or more examples may solve problems related to the above technical issue, providing a method and isolation structure to obtain an isolation breakdown voltage (ISO BV) higher than an operation voltage of a semiconductor device for high voltage.

The one or more examples may provide a method to stably maintain an isolation breakdown voltage (ISO BV) despite a process changeability.

The description in this patent discloses new robust deep-trench isolation (DTI) structures to improve DTI Iso BV and immunity to variation of Iso BV with process parameters, e.g., silicon loss, channel stop implants, etc.

FIG. 1 illustrates a cross-sectional view of a deep trench isolation in accordance with one or more embodiments of the disclosure.

A semiconductor substrate 10 may include a shallow trench isolation (STI) 20 and a hard mask pattern 30. The hard mask pattern 30 may be implemented as an etch stop region when forming a deep trench isolation (DTI) 40. The DTI 40 may have a deeper depth than the STI 20. In an example, a depth of the DTI 40 may be 19-40 μm, and its width may be 1.0-4.0 μm. Its inclination angle may be 88-90°. A channel stop region 45 may be formed just under the bottom of the DTI 40 to prevent a leakage current. The DTI 40 may be etched from a top of the semiconductor substrate 10, and the DTI 40 may be formed with a width that becomes narrower toward the bottom. The DTI 40 may be filled with several insulating films. In an example, the DTI 40 may be filled with a side wall oxide film 50 and gap-fill insulating film 60 with air gap or void 70. The side wall oxide film 50 may be deposited by a LPCVD method. The gap-fill insulating film 60 may be implemented by Borophosphosilicate Glass (BPSG) film. The air gap or void 70 may be inside the gap-fill insulating film 60. Another example, a single material without void may be formed inside the DTI 40. Further, inter-layer insulating films 80 and 90 may be formed on the gap-fill insulating film 60 implemented by BPSG film or Tetraethyl orthosilicate (TEOS) film.

Figure 2:
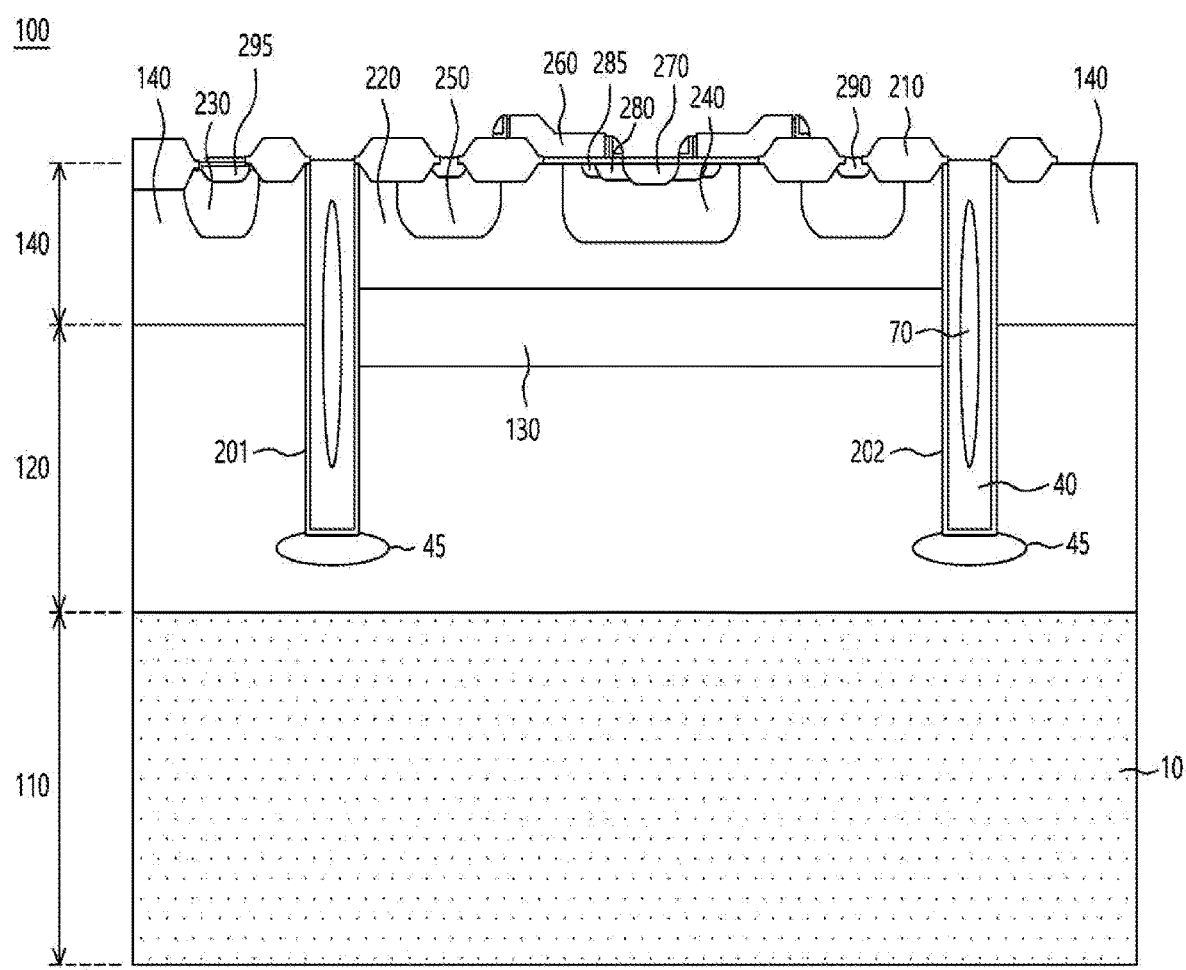
FIG. 2 illustrates a cross-sectional view of a high voltage device formed between deep trench isolations in accordance with one or more embodiments of the disclosure.

FIG. 2 illustrates a cross-sectional view of a high voltage device formed between deep trench isolations in accordance with one or more embodiments of the disclosure.

In accordance with one or more examples of the disclosure, a high voltage semiconductor device 100 may include DMOS, LDMOS, EDMOS, and BCD devices having breakdown voltages over 40V. As illustrated in FIG. 2, the high voltage semiconductor device 100 may include P-type lightly doped semiconductor layer 110; an undoped silicon layer 120 formed on the P-type lightly doped semiconductor layer 110; a highly doped N-type buried layer (NBL) 130 formed on the undoped silicon layer 120, wherein the NBL layer is formed by ion implantation and high-temperature anneal processes; a P-type epi-layer 140 formed on the highly doped NBL 130; the first and second deep trench isolations 201 and 202 formed across the P-type epi-layer 140 and the undoped silicon layer 120; and a high voltage device between the first deep trench isolation (DTI) 201 and the second deep trench isolation 202. Additionally, the air gap 70 may be formed inside each of the first and the second DTIs 201 and 202. The P-type channel stop region 45 implemented by implantation may be formed respectively under the first and the second DTIs 201 and 202. The implanted channel stop region 45 may be formed in a portion of the undoped silicon layer 120. A description of the internal structure of the first and second DTIs 201 and 202 is the same as the description of the structure mentioned in FIG. 1, and thus will be omitted.

In accordance with one or more examples of the disclosure, the high voltage semiconductor device 100 may further include a field oxide film 210 formed on the P-type epi-layer 140; a N-type drift region or a lightly-doped N-type well region (HDNW) 220 and a P-type well region (PW) 230; a P-type body region (PBODY) 240 and a N-type well region (NW) 250 formed in the HDNW 220; a gate electrode, i.e. the N-type heavily-doped polysilicon layer 260; a P-type pickup region 270, a N-type source region 280, and a N-type LDD region 285 formed in the PBODY 240; a N-type drain region 290 formed in the NW 250; and a P-type pickup region 295 formed in the PW 230. Herein, a HDNW means a high voltage deep N-type well region. NW and PW mean N-type and P-type well regions, respectively. PBODY means P-type body region.

In FIG. 2, although the field oxide film 210 is illustrated as a LOCOS, it may be replaced with the STI 20 in FIG. 1 to reduce the size of a chip. The gate electrode 260 may have a ring shape. The PBODY 240 and the source region 280 may be formed inside the ring region, and the drain region 290 may be formed outside the ring region. As the PBODY 240 is surrounded by N-type regions 130, 220, and 250, a fully isolated structure may be formed with electrically separated from the P-type lightly doped semiconductor layer 110 or the undoped silicon layer 120. Therefore, a voltage that is different from a ground voltage may be applied to the source region 280. The same bias voltage may be applied to the electrodes of the source region 280 and the pickup region 270. As the P-type lightly doped semiconductor layer 110 and the undoped silicon layer 120 are electrically connected to the P-type well region (PW) 230, the ground voltage may be applied.

In accordance with one or more examples of the disclosure, the undoped silicon layer 120 may be formed on the P-type lightly doped semiconductor layer 110 at the beginning of BCD process. A thickness of the undoped silicon layer 120 may be a significant process parameter in order to improve an isolation breakdown voltage. The undoped silicon layer 120 may be formed starting from the highly doped NBL 130 toward the P-type lightly doped semiconductor layer 110. The undoped silicon layer 120 may be formed surrounding bottoms of the first and the second DTIs 201 and 202. A thickness of the undoped silicon layer 120 may be thicker than that of the highly doped NBL 130. In an example, a resistance of the undoped silicon layer 120 may be greater than that of the P-type lightly doped semiconductor layer 110 because the undoped silicon layer 120 is formed by undoped intrinsic silicon. The undoped silicon layer 120 is not doped, and it comprises an intrinsic silicon material that does not have N-type or P-type conductivity. The undoped silicon layer 120 may be a pure semiconductor layer that does not have N-type or P-type dopant type. Therefore, the number of charge carriers may be determined by characteristics of material itself, not by an amount of impurities. The undoped silicon layer may be formed by an epitaxial growth. After a manufacturing process is completed, a thickness of the undoped silicon layer 120 may become thinner than a predetermined thickness because some of dopants in the highly doped NBL 130 may be diffused to the undoped silicon layer 120 during a high temperature annealing. Therefore, the undoped silicon layer 120 may overlap a portion of the NBL. In an example, a thickness of the undoped silicon layer 120 may range from 20 μm to 25 μm.

In accordance with one or more examples of the disclosure, the highly doped NBL 130 may be formed by performing an ion implantation process with antimony (Sb) or phosphorus (P) impurities. After the ion implantation process, annealing process is performed to activate the implanted dopants. The highly doped NBL 130 may have a doping concentration of 1E17-1E20/cm3 higher than a doping concentration of the undoped silicon region 120 or the P-type lightly doped semiconductor layer 110, wherein the P-type lightly doped semiconductor layer 110 may have a doping concentration of 1E14-1E16/cm3.

In an example, when the nLDMOS, used as a high voltage device, is operated in a high side (HS) mode, a source voltage may be higher than a substrate voltage because the source region 280 is connected to a load of the next stage. To solve the electronic insulation issue, the highly doped NBL 130 may be disposed under the source region 280. The highly doped NBL 130 may prevent punch-through between a source region of an N-type LDMOS (nLDMOS) and the P-type lightly doped semiconductor layer 110.

The existence of the highly doped NBL 130 may limit the extension of the depletion region from the P-type lightly doped semiconductor layer 110 due to the high doping concentration of the highly doped NBL 130. In that case, there may be a limitation to increase a breakdown voltage (BV) in the LDMOS. However, the undoped silicon layer 120 may be helpful to increase a breakdown voltage (BV) in the LDMOS. A SOI (silicon-on-insulator) layer may be implemented instead of the undoped silicon layer 120, but the SOI process has disadvantages of high cost and low thermal conductivity.

In accordance with one or more examples of the disclosure, the P-type epi-layer 140 may be formed by an epitaxial growth process. In order to embody a LDMOS device having a breakdown voltage over 100V, a thick P-type epi-layer 140 may be implemented between a highly doped drain/N-type source region and the P-type lightly doped semiconductor layer 110.

Figure 3:
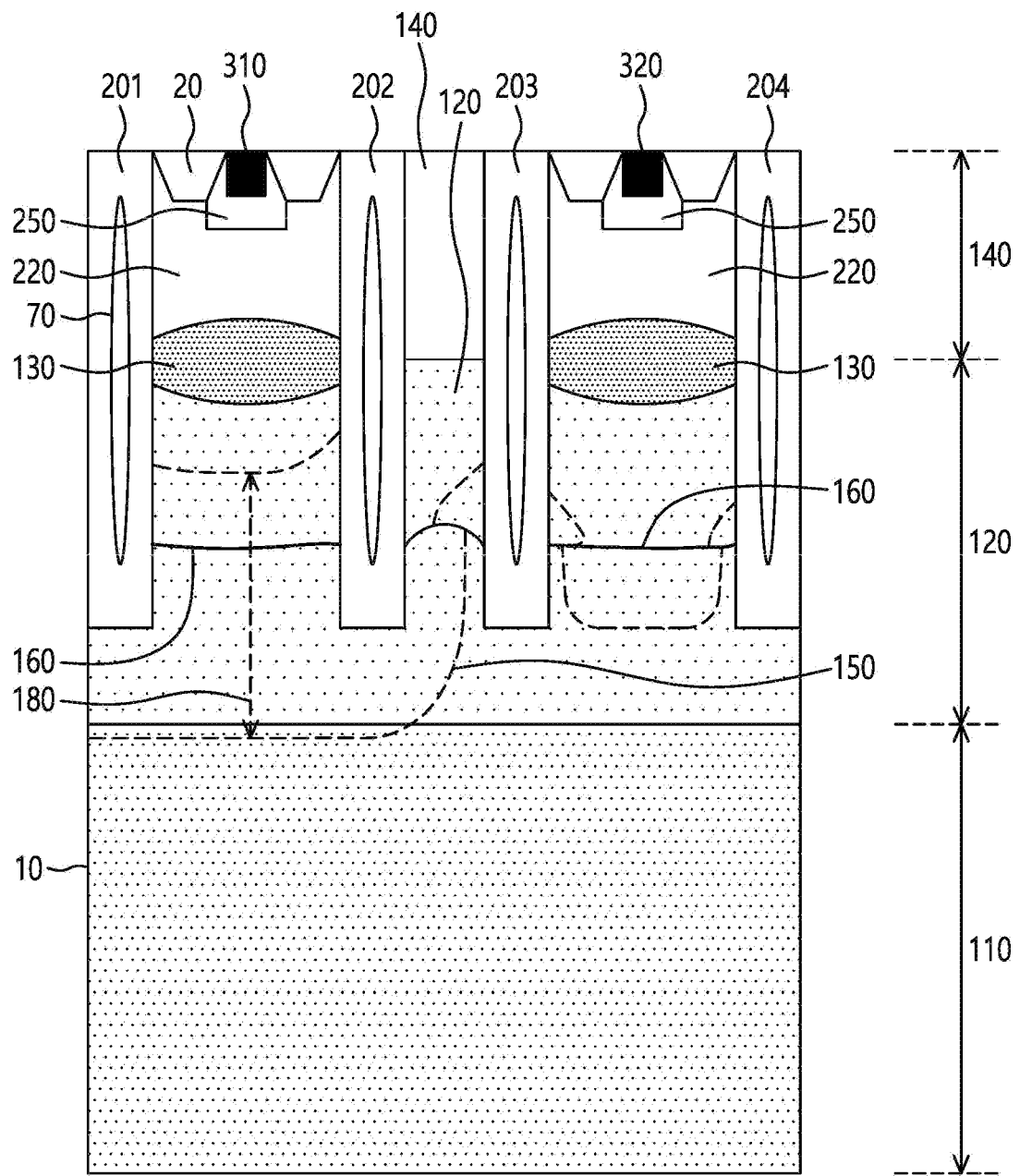
FIG. 3 illustrates a cross-sectional view of a semiconductor device in accordance with one or more embodiments of the disclosure.

FIG. 3 illustrates a cross-sectional view of a semiconductor device for technology computer aided design (TCAD) simulation on isolation breakdown voltage (ISO BV) in accordance with one or more examples of the disclosure.

In an embodiment of the disclosure, a semiconductor device 300 including a first N-type highly doped region (collector) 310 and a second N-type highly doped region (emitter) 320 is shown as an example for evaluation for ISO BV and TCAD simulation.

In accordance with one or more examples of the disclosure, the semiconductor device 300 may include the first to fourth deep trench isolation 201-204. It may be divided into the first region disposed between the first deep trench isolation 201 and the second deep trench isolation 202; and the second region disposed between the third deep trench isolation 203 and the fourth deep trench isolation 204. Or, it may be divided into a high voltage application region between the first deep trench isolation 201 and the second deep trench isolation 202; and a low voltage application region between the third deep trench isolation 203 and the fourth deep trench isolation 204.

A first highly doped NBL 130 (left) and a second highly doped NBL 130 (right) may be disposed respectively in the first region and the second region. The first N-type highly doped buried layer 130 (left) is formed on the undoped silicon layer 120, and is disposed between the first deep trench isolation 201 and the second deep trench isolation 202. The second N-type highly doped buried layer 130 (right) is formed on the undoped silicon layer 120, and is disposed between the third deep trench isolation 203 and the fourth deep trench isolation 204. The undoped silicon layer 120 surrounds bottoms of the first to fourth deep trench isolations 201-204, and has a thickness greater than a thickness of the first or second N-type highly doped buried layer 130.

The undoped silicon region 120 and the P-type epi-layer 140 may be formed in direct contact with each other between the second deep trench isolation 203 and the third deep trench isolation 204.

The semiconductor device 300 may further include the HDNW 220 formed on the highly doped NBL 130 respectively in the first region or the second region, and the NW 250 formed in the HDNW 220. The semiconductor device 300 may further include the first N-type highly doped region (collector) 310 and the second N-type highly doped region (emitter) 320 formed in the first region and the second region, respectively. The first N-type highly doped region (collector) 310 and the second N-type highly doped region (emitter) 320 may be formed by a high doping concentration. The first N-type highly doped region (collector) 310 may be electrically connected to a collector electrode, and the second N-type highly doped region (emitter) 320 may be electrically connected to an emitter electrode.

A plurality of shallow trench isolations (STI) 20 may be formed at right/left sides of the first N-type highly doped region (collector) 310 and the second N-type highly doped region (emitter) 320. The shallow trench isolation (STI) 20 may be deeper than the first N-type highly doped region (collector) 310 and the second N-type highly doped region (emitter) 320 but shallower than the NW 250.

An NPN parasitic transistor may comprises the first N-type highly doped region (collector) 310, the P-type lightly doped semiconductor layer 110 as a base region and the second N-type highly doped region (emitter) 320. By applying a high voltage to the first N-type highly doped region (collector) 310, and after applying the ground voltage to the P-type lightly doped semiconductor layer 110 and the second N-type highly doped region (emitter) 320, an isolation breakdown voltage (ISO BV) of the NPN parasitic transistor may be measured. That is, the ISO BV may be a collector to emitter breakdown voltage (BVceo or BVces) for the NPN parasitic transistor.

In an embodiment of the disclosure, PN junctions 160 may be formed inside the undoped silicon layer 120. The PN junctions 160 may be formed by a diffusion of dopants of the P-type lightly doped semiconductor layer 110 and the highly doped NBL 130 toward the undoped silicon layer 120 after thermal processes. The PN junctions 160 may be formed closer to bottoms of the first to fourth deep trench isolations 201-204. That is, the PN junctions 160 may be formed far from a point 130a (see FIG. 5), wherein the point 130a means a maximum doping concentration of the highly doped NBL 130. The PN junctions 160 may be formed near bottoms of the first to fourth deep trench isolations 201-204.

In an embodiment of the disclosure, based on the PN junctions 160, a depletion region 180 may be formed deeper toward the P-type lightly doped semiconductor layer 110, rather than the highly doped NBL 130, mainly due to a difference of doping concentrations. That is, a doping concentration of the highly doped NBL 130 may be much higher than that of the P-type lightly doped semiconductor layer 110. Also, by adding the undoped silicon layer 120, a location of the PN junctions 160 may be moved more toward the P-type lightly doped semiconductor layer 110. Since the undoped silicon layer 120 is an intrinsic silicon layer, it may support an extension of the depletion region 180. In the drawing, the mark '150' illustrates an edge (boundary line) of the depletion region below. For reference, based on the PN junctions 160, a depletion region that is upper than the PN junctions 160 may be generated by the P-type lightly doped semiconductor layer 110. Additionally, a depletion region that is lower than the PN junctions 160 may be generated by the highly doped NBL 130.

In an embodiment of the disclosure, the depletion region 180 (dotted) may be largely formed toward the P-type lightly doped semiconductor layer 110. Since the undoped silicon region 120 has an extremely low doping concentration than other regions, the depletion region may be extended to the P-type lightly doped semiconductor layer 110. Therefore, the depletion region may be thick, and accordingly, the isolation breakdown voltage of the semiconductor device in FIG. 3 may be much higher than that of typical semiconductor devices.

Figure 4:
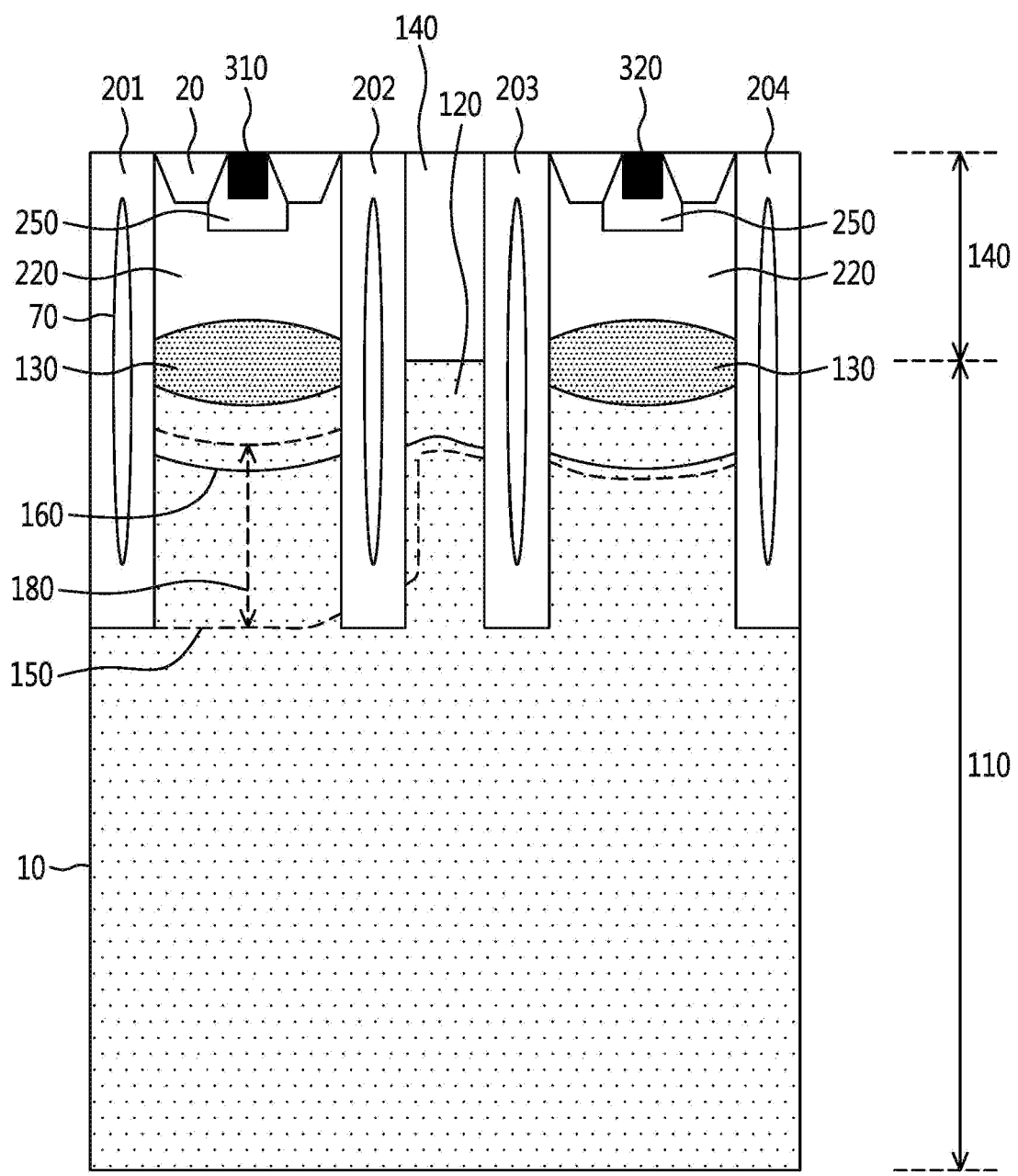
FIG. 4 illustrates a cross-sectional view of a typical semiconductor device to compare with the semiconductor device of the disclosure.

FIG. 4 illustrates a cross-sectional view of a typical semiconductor device to compare with the semiconductor device of the disclosure.

The semiconductor device 400 illustrated in FIG. 4 has no undoped silicon layer compared to the semiconductor device 300 of FIG. 3, although the structure is generally the same. Therefore, the same marks are given in FIG. 4. That is, in the semiconductor device 400 of FIG. 4, deep trench isolations 201-204 may be formed in the P-type lightly doped semiconductor layer 110. The device may include the P-type lightly doped semiconductor layer 110 (base region), the highly doped NBL 130, and the P-type epi-layer 140. The HDNW 220, the NW 250, the first N-type highly doped region (collector) 310, and the second N-type highly doped region (emitter) 320 may be formed in the P-type epi-layer 140. The first N-type highly doped region (collector) 310 and the second N-type highly doped region (emitter) 320 may be formed with a high doping concentration.

In FIG. 4, the PN junctions 160 may be formed inside the P-type lightly doped semiconductor layer 110 in the typical semiconductor device 400. The PN junctions 160 may be formed by the diffusion of dopants in the highly doped NBL 130 and in the P-type lightly doped semiconductor layer 110. The PN junctions 160 may be formed closer to the highly doped NBL 130. That is, the PN junctions 160 may be formed close to a point 130a (see FIG. 6), where the maximum doping concentration of the highly doped NBL 130 appears. An area of the depletion region 180 in FIG. 4 is smaller than that of the depletion region 180 in FIG. 3 because of the absence of an undoped silicon in the typical semiconductor device 400. Accordingly, an ISO breakdown voltage of the typical semiconductor device 400 may be lower than an ISO breakdown voltage of the semiconductor device 300 of the disclosure. In the drawing, the mark '150' illustrates an edge (boundary line) of the depletion region below.

Figure 5:
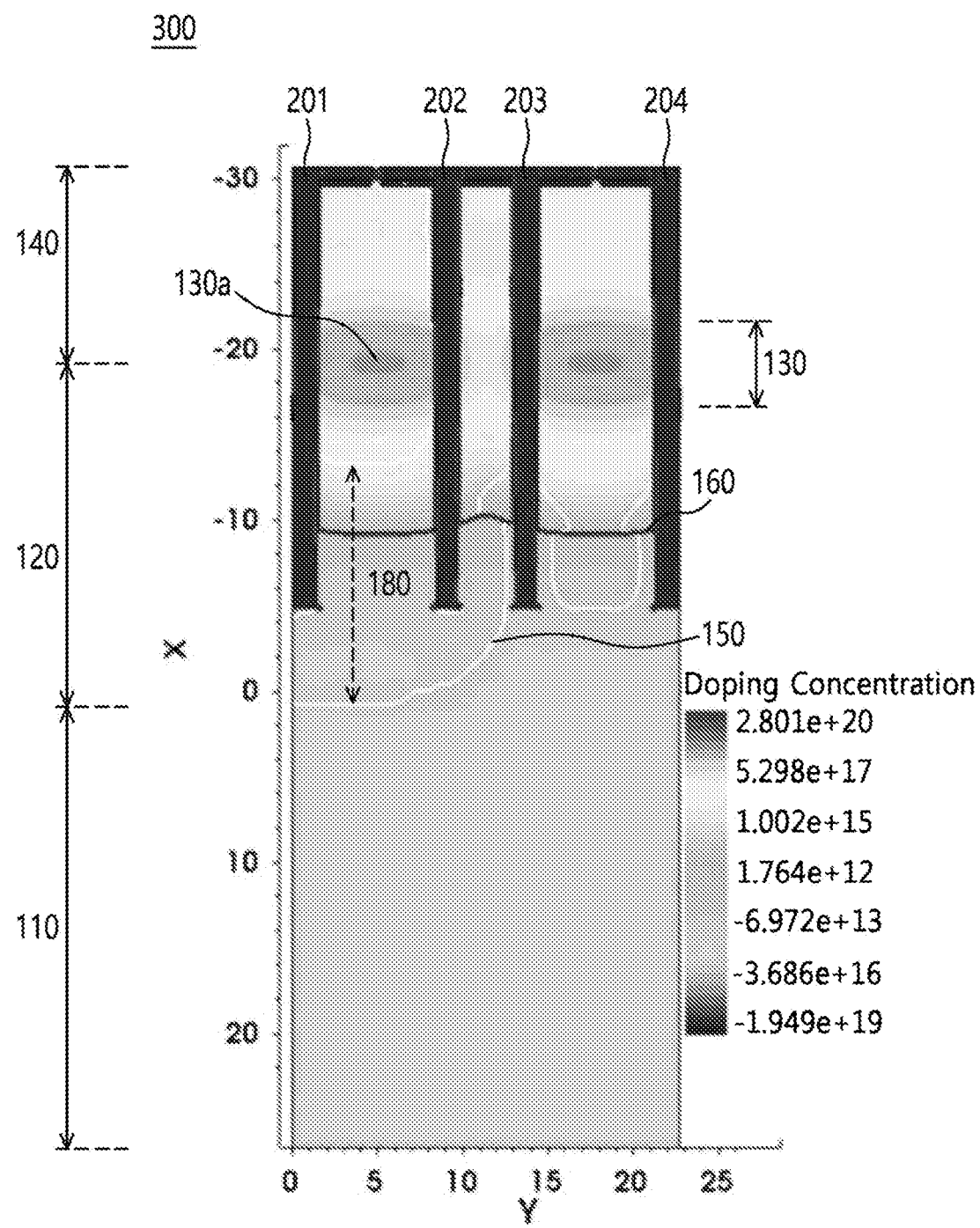
FIGS. 5 and 6 illustrate simulation results of net doping profiles of the semiconductor device of the disclosure and the typical semiconductor device.
Figure 6:
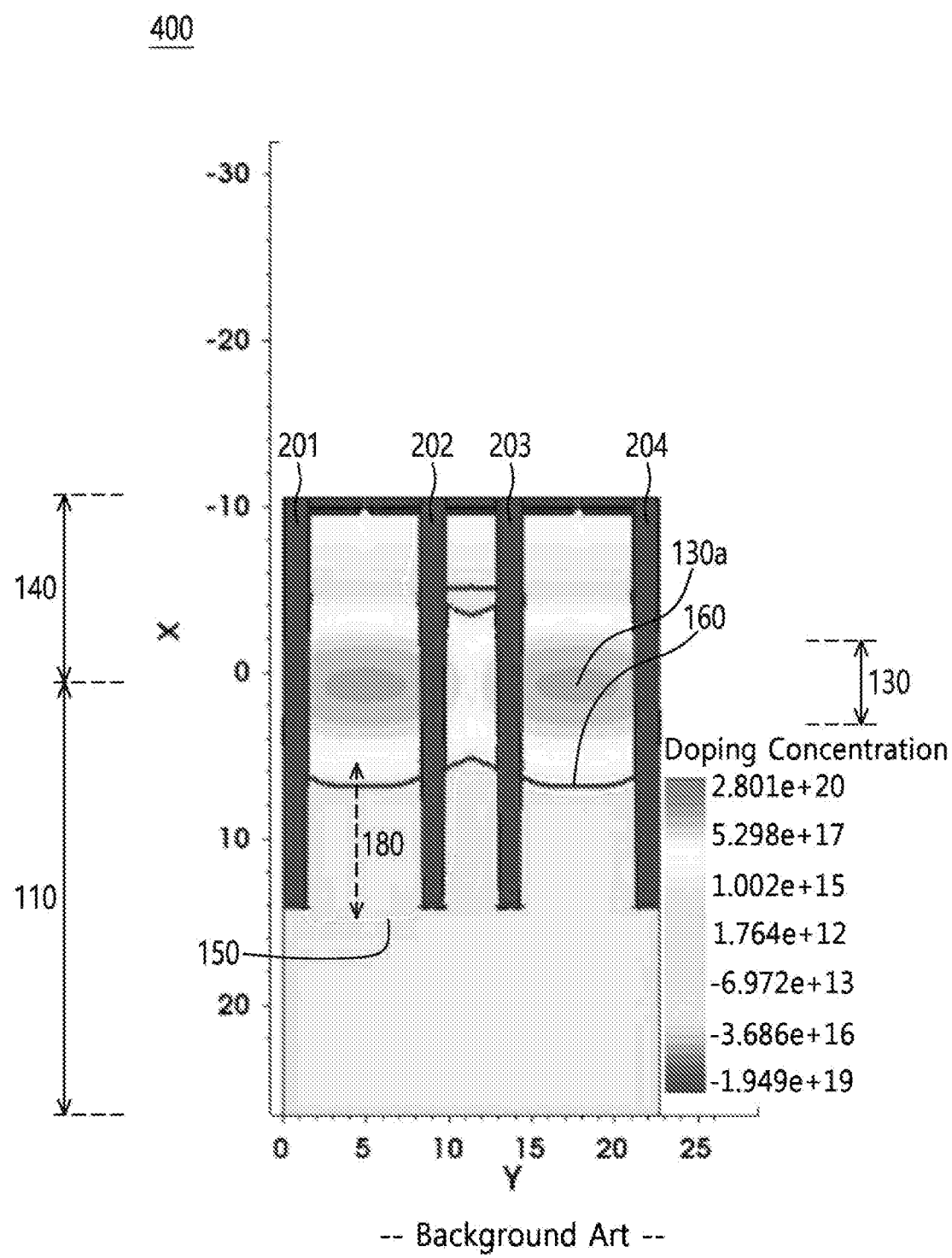

FIGS. 5 and 6 illustrate simulation results of net doping profiles of the semiconductor device of one or more examples and the typical semiconductor device, respectively.

FIG. 5 illustrates the semiconductor device 300 of one or more examples with the undoped silicon layer, and FIG. 6 illustrates the typical semiconductor device 400 without the undoped silicon layer.

In FIG. 5, the undoped silicon layer 120 may be formed on the top of the P-type lightly doped semiconductor layer 110. Its typical initial thickness is 20 μm. The P-type epi-layer 140 may be formed on the undoped silicon layer 120. Its typical thickness is 10 μm. The highly doped buried layer 130 may be disposed at the boundary of the undoped silicon layer 120 and the P-type epi-layer 140. When forming the highly doped NBL 130, dopants may be implanted toward the undoped silicon layer 120. Therefore, the highly doped NBL 130 may be partially overlapped with the undoped silicon layer 120. Accordingly, the final thickness of the undoped silicon layer 120 may be reduced than the initial thickness 20 μm. In an example, it may be below 15 μm.

As shown in FIG. 5, the P-type lightly doped semiconductor layer 110 may have the doping concentration of 1E14-1E16/cm3, and the highly doped NBL 130 may have the doping concentration of 1E17-1E20/cm3. The doping concentration of the highly doped NBL 130 may be higher than the doping concentration the P-type lightly doped semiconductor layer 110, about 3 to 4 order. Therefore, based on the PN junctions 160, the depletion region 180 may be largely formed toward the P-type lightly doped semiconductor layer 110, rather than the highly doped NBL 130. A first PN junction 160 (left) may be formed closer to the bottoms of the first and the second deep trench isolations 201 and 202, rather than the point 130a where the maximum doping concentration of the highly doped NBL 130 appears.

The PN junctions 160 may be located inside the undoped silicon layer 120. The PN junctions 160 may be formed by diffusion of the dopants in the P-type lightly doped semiconductor layer 110 and the highly doped NBL 130 into the undoped silicon layer 120 after thermal processes. A doping concentration near the PN junctions 160 may be 1E11-1E13/cm3. Since the PN junctions 160 is formed in the undoped silicon layer 120, the doping concentration near the PN junctions 160 is supposed to be low. Therefore, the depletion region 180 may be much larger than that of typical devices without the undoped silicon layer. The maximum width of the depletion region 180 may be about 14 μm from the top of the depletion region to the bottom of the depletion region. An ISO BV may be over 150V (see FIG. 9). It is because the undoped silicon layer 120, which is an intrinsic semiconductor region, may be disposed between the P-type lightly doped semiconductor layer 110 and the highly doped NBL 130. The undoped silicon layer 120 is an intrinsic semiconductor region and work as a buffer layer.

In FIG. 6, the maximum width of the depletion region 180 may be about 8 μm. Compared with FIG. 5, an area of the depletion region 180 in FIG. 6 may be relatively small. An ISO BV of the device in FIG. 6 may be 120-130V (see FIG. 9). In FIG. 6, a doping concentration near the PN junctions 160 may be 1E16-1E17/cm3. Compared with FIG. 5, the doping concentration near the PN junctions 160 in FIG. 6 may be higher over 3-4 order. A first PN junction 160 (left) may be formed closer to the point 130a where the maximum doping concentration of the highly doped NBL 130 appears, rather than near the bottoms of the first and the second deep trench isolations 201 and 202. Since the doping concentration near the PN junctions 160 in FIG. 6 is higher than the disclosure, the ISO BV of the device in FIG. 6 cannot be higher than that in FIG. 5.

Figure 7:
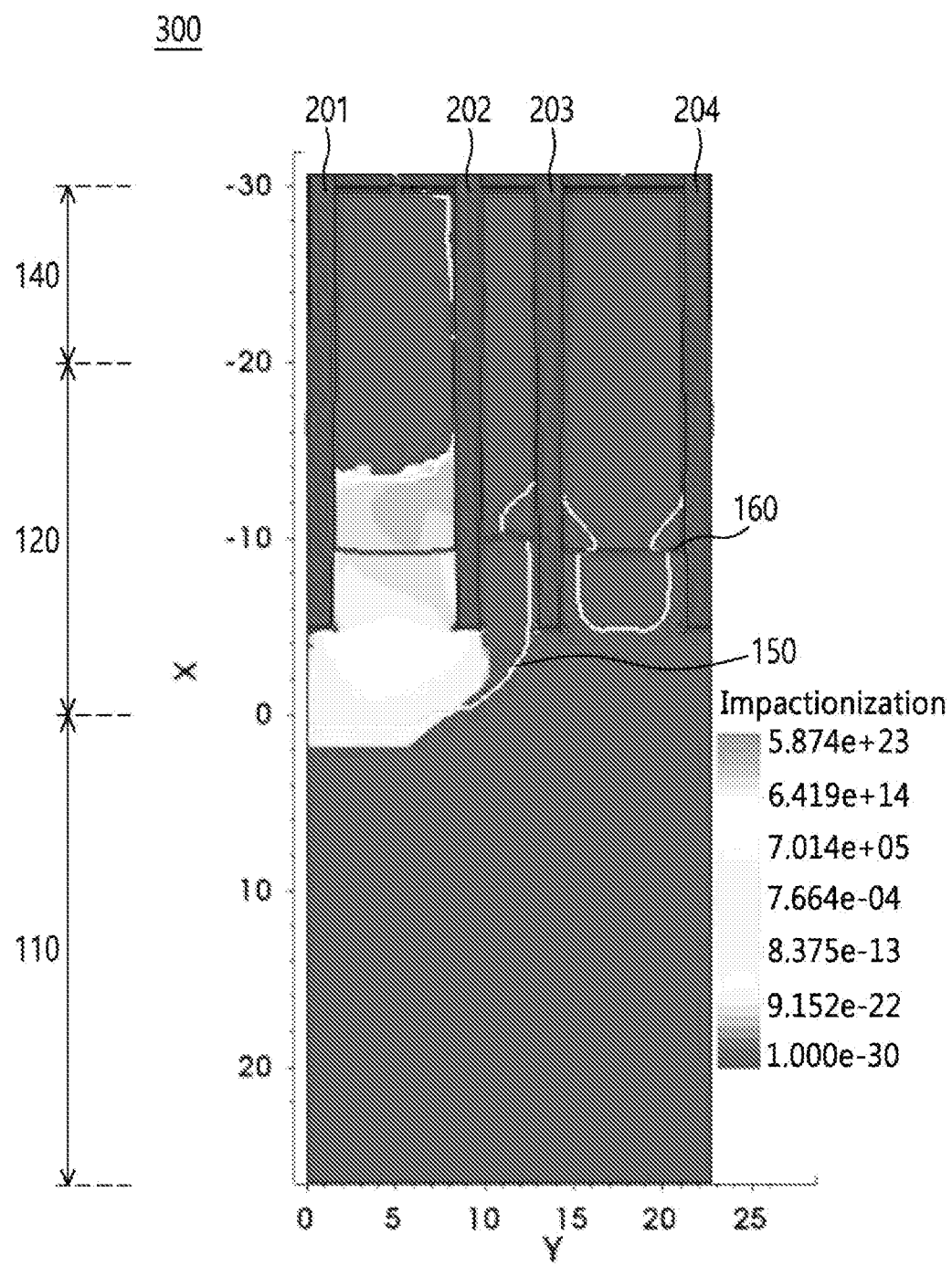
FIGS. 7 and 8 illustrate simulation diagrams illustrating impact ionization rate distributions inside the semiconductor device of the disclosure and the typical semiconductor device.
Figure 8:
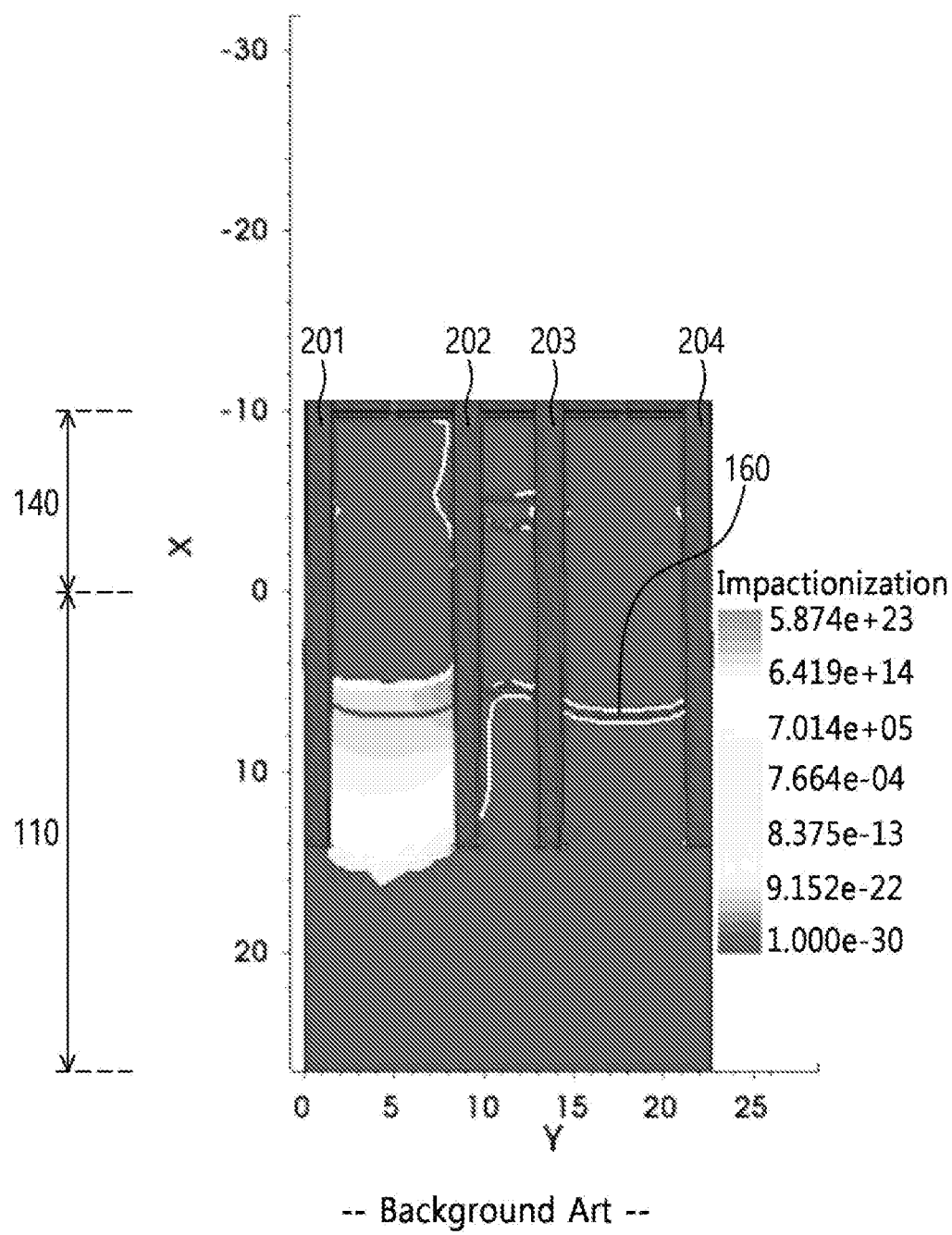

FIGS. 7 and 8 illustrate simulation diagrams illustrating impact ionization rate distributions inside the semiconductor device of the disclosure and the typical semiconductor device.

In the drawings, the red portion represents a high impact ionization rate, while the blue portion represents a low impact ionization rate. A high impact ionization rate may refer to that an electric field is locally high after applying a high reverse bias voltage to a first N-type highly doped region (collector) 310. Acceleration may be possible by obtaining an energy of electrons or holes from the high electric field, and a new electron-hole pair generation rate may increase after colliding atoms in a semiconductor grid, resulting in increasing current.

Comparing FIG. 7 with FIG. 8, the example of FIG. 7 shows lower impact ionization rate and more uniformly distributed electric field contours in the depletion region of the PN junction 160 between the DTIs 201 and 202. Also, due to the more uniformly distributed electric field contours in the depletion region, an ISO BV of the structure in FIG. 7 may increase more. On the other hand, in the typical structure in FIG. 8, the impact ionization rate is locally high near the PN junction adjacent to DTI in the depletion region. Additionally, due to a high and intensive electric field throughout the narrow area, there is a limitation to increase an ISO BV accordingly. The disclosure may suggest a new semiconductor device structure including the undoped silicon layer 120 to minimize a dependency of process changeability and to increase a DTI breakdown voltage or ISO BV. By the undoped silicon layer 120 in the new device, a PN junction depletion region may be become larger and is formed between the P-type lightly doped semiconductor layer 110 and the highly doped N-type buried layer 130, and the contours of the electric field or the impact ionization rate contours may not be concentrated locally. When having the undoped silicon layer 120 as suggested in the disclosure, it may be beneficial to minimize a dependency of process changeability and to increase a DTI breakdown voltage or ISO BV.

Figure 9:
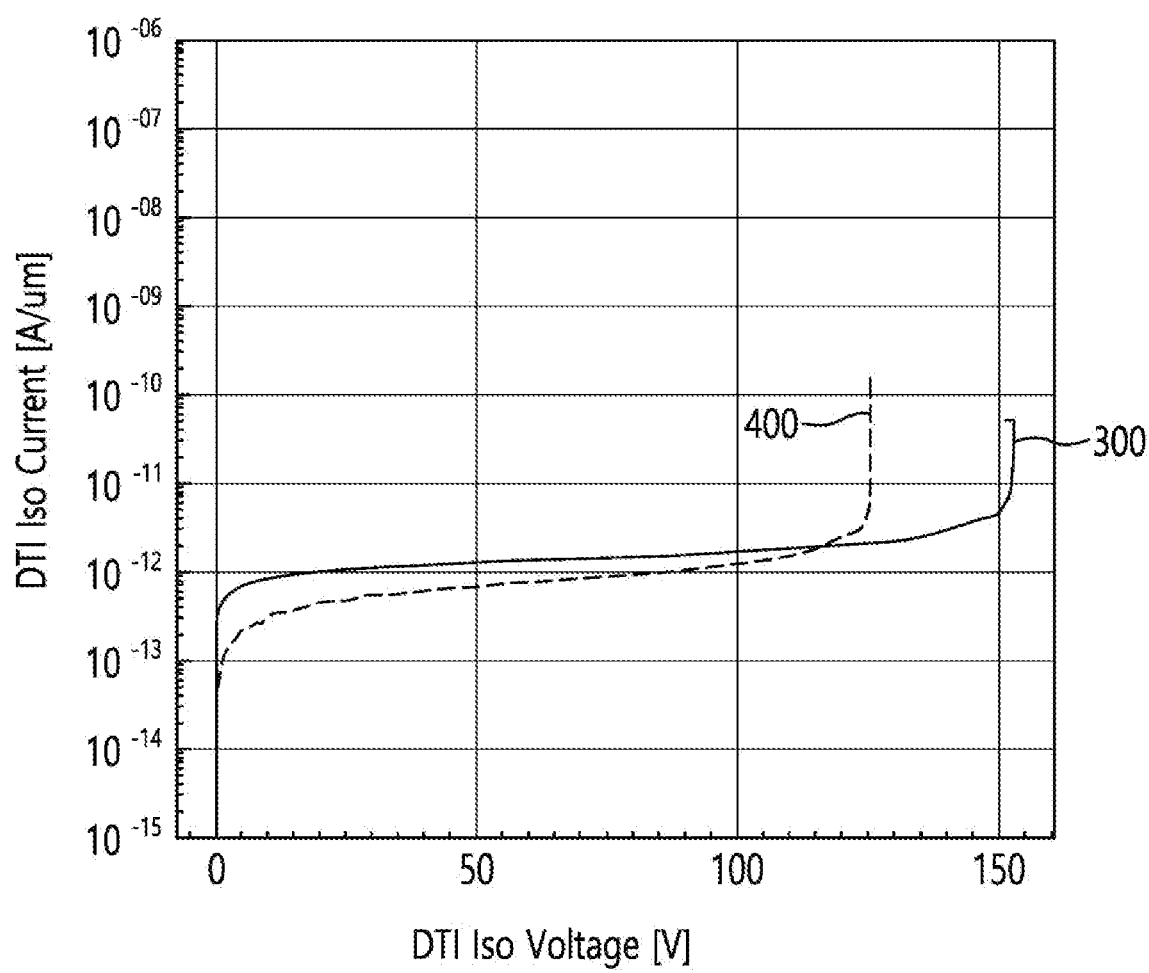
FIG. 9 illustrates a graph showing electrical characteristics of the semiconductor device of the disclosure and the typical semiconductor device.

FIG. 9 illustrates a graph illustrating electrical characteristics of the semiconductor device of the disclosure and the typical semiconductor device.

FIG. 9 shows ISO BV values according to simulation results of a structure of the disclosure having the undoped silicon layer and the typical structure without the undoped silicon layer. In FIG. 3 or FIG. 4, a high voltage may be applied to the first N-type highly doped region (collector) 310, and the ground voltage may be applied to the second N-type highly doped region (emitter) 320 and the P-type lightly doped semiconductor layer (base) 110. Then, an isolation breakdown voltage (ISO BV) may be measured. That is, the ISO BV may be an emitter to collector breakdown voltage of NPN parasitic BJT. The simulation is conducted in 0.18 μm BCD process, based on 80V DMOS, and it is discovered that the typical semiconductor device 400 has the ISO BV of 110-130V. On the other hand, the semiconductor device 300 of the disclosure has the ISO BV over 150V, which represents that the ISO BV increases. As described earlier, it is because the electric field and impact ionization rate contours may have more even distribution due to the undoped silicon layer 120.

Accordingly, the disclosure may manufacture a semiconductor device with ISO BV higher than that of a typical case, by adding the undoped silicon layer (undoped Si) 120 formed by the intrinsic silicon that is undoped and formed between the P-type lightly doped semiconductor layer 110 and the P-type epi-layer 140. The highly doped N-type buried layer 130 may be formed on the undoped silicon layer 120 (undoped Si) by diffusion of impurities in a thermal process, after applying ion implantation.

Meanwhile, in one or more examples of the disclosure, the ISO BV may be more improved by adjusting a thickness of the undoped silicon layer 120 with a DTI depth of 25 μm. In an example, when a thickness of the undoped silicon layer 120 is 5-15 μm in the simulation, the ISO BV is about 120-140V, which is approximately 5.6% higher than the typical case of 110-130V without the undoped silicon layer. When the thickness of the undoped silicon layer 120 is 10-30 μm, the ISO BV may be improved higher than 150V. There is no significant change in ISO BV when the thickness of the undoped silicon layer 120 becomes much thicker over a certain point. Based on the results, the thickness of the undoped silicon layer 120 in the disclosure may be desired to be 10-30 μm, but it is not limited thereto.

Figure 10:
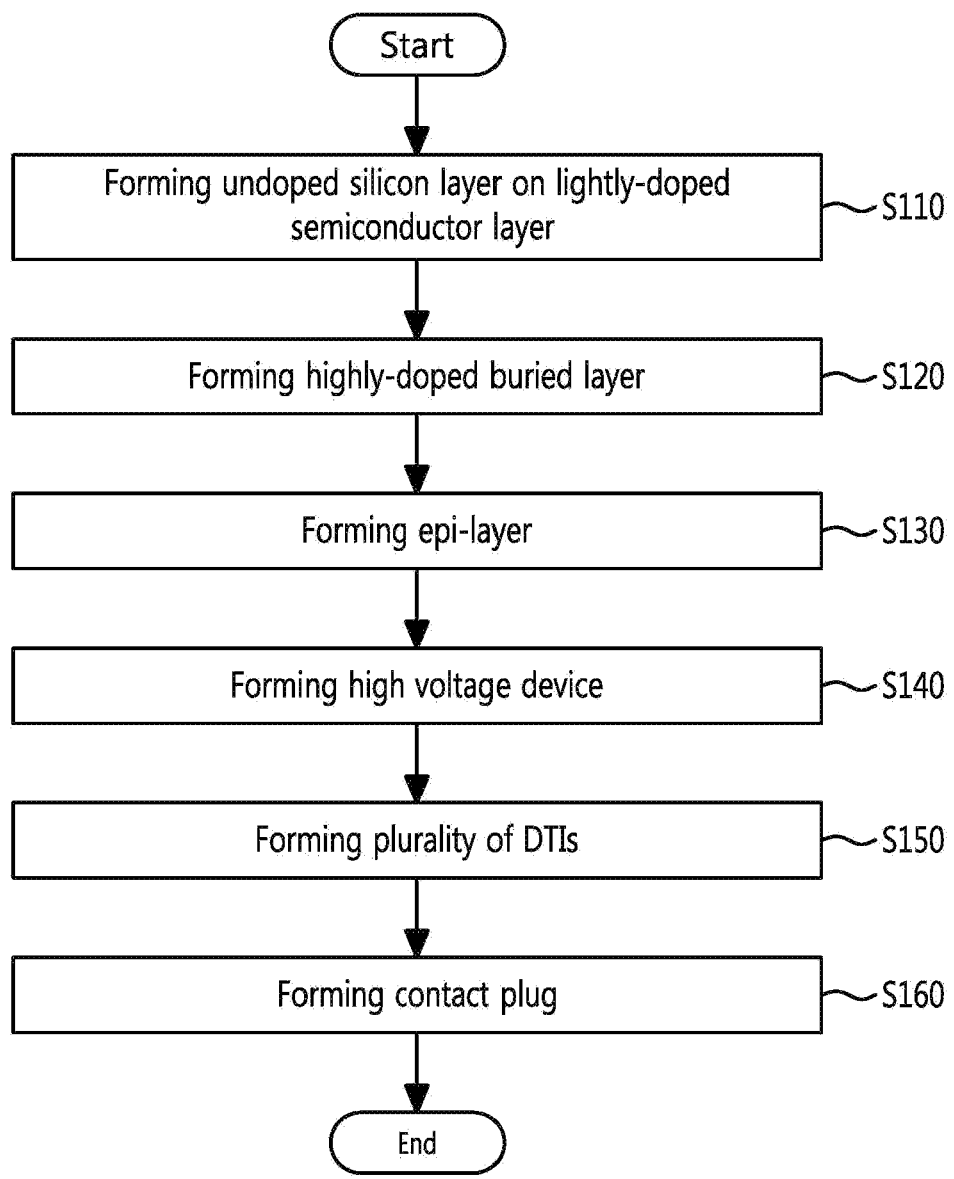
FIG. 10 illustrates a flow chart of manufacturing process of the semiconductor device of the disclosure.

FIG. 10 illustrates a flow chart of manufacturing process of the semiconductor device of the disclosure.

In operation 110, the undoped silicon layer 120 may be formed on the P-type lightly doped semiconductor layer 110. A thickness of the undoped silicon layer 120 may be 10-30 μm.

In operation 120, the highly doped NBL 130 may be formed on the undoped silicon layer 120. When forming the highly doped N-type buried layer 130, an area of the highly doped NBL 130 may be extended toward the undoped silicon layer 120. Therefore, the thickness of the undoped silicon layer 120 may be practically reduced than the initial thickness. That is, it may be reduced as much as an extended thickness of the highly doped NBL 130 into the undoped silicon layer 120.

In operation 130, the P-type epi-layer 140 (doped semiconductor layer) may be formed on a top of the highly doped NBL 130, having a thickness of 5-15 μm. The P-type epi-layer 140 (uniformly doped semiconductor layer) may be formed by an epitaxial growth.

In operation 140, a high voltage device may be formed in the P-type epi-layer 140. To form the high voltage device, the HDNW 220 may be formed, and the NW 250 may be formed in the HDNW 220. The first N-type highly doped region (collector) 310 and second N-type highly doped region (emitter) 320 may be formed in order in the NW 250.

In operation 150, after forming the high voltage device, the first to fourth DTI 201-204 may be formed in the semiconductor substrate 10. Or, the first to fourth DTI 201-204 may be formed before forming the high voltage device. The first to fourth DTI 201-204 may be started from the surface of the P-type epi-layer 140, and they may penetrate the HDNW 220 and the highly doped NBL 130 into the undoped silicon layer 120. A deep trench may be formed through an etching process. After forming the deep trench, a channel stop region 45 may be formed through an ion implantation inside the trench. An insulating film, for examples, BPSG, oxide film, or undoped polysilicon may fill the deep trenches. A void or air gap may be formed inside the deep trench.

In operation 160, contact plugs may be formed to contact the source region, the drain region and pick-up region.

According to one or more examples, by adding an undoped silicon layer only between a P-type lightly doped layer of a semiconductor device having dual deep trench isolations and an N-type highly doped buried layer, it may increase and stabilize the isolation breakdown voltage (ISO BV) by expanding a silicon depletion region between DTIs and preventing local intensification of electric field and impact ionization rate contours in the depletion region.

According to one or more examples, by adding an undoped silicon layer, a depletion region may be formed larger than a typical structure, and distributions of electric field and impact ionization rate contours may become more uniform and less intensified.

While this disclosure includes specific examples, it will be apparent after an understanding of the one or more examples of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:
1. A semiconductor device, comprising:
a semiconductor substrate comprising a first conductivity type semiconductor layer;
a high-resistance silicon layer disposed on the first conductivity type semiconductor layer and having a resistance higher than a resistance of the first conductivity type semiconductor layer;

a first buried layer of a second conductivity type disposed on the high-resistance silicon layer and spaced apart from the first conductivity type semiconductor layer; and a first deep trench isolation and a second deep trench isolation, each filled with an insulating film having an air gap and each disposed from an upper surface of the semiconductor substrate through the first buried layer of the second conductivity type to the high-resistance silicon layer, wherein the air gap overlaps the high-resistance silicon layer laterally.

2. The semiconductor device of claim 1, wherein the high-resistance silicon layer comprises an undoped silicon layer.

3. The semiconductor device of claim 1, wherein a first PN junction is formed by the first conductivity type semiconductor layer and the first buried layer of the second conductivity type, and disposed between the first and second deep trench isolations.

4. The semiconductor device of claim 1, further comprising:
a collector region disposed between the first and second deep trench isolations; and
a lightly-doped well region disposed between the collector region and the first buried layer of the second conductivity type,
wherein the lightly-doped well region and the first buried layer overlap laterally with the air gap of the first deep trench isolation or the second deep trench isolation.

5. The semiconductor device of claim 4, further comprising:
shallow trench isolation regions disposed adjacent to the collector region; and
a second conductivity type well region disposed below the collector region.

6. The semiconductor device of claim 1, further comprising:
a third deep trench isolation and a fourth deep trench isolation disposed from the upper surface of the semiconductor substrate to the high-resistance silicon layer;
a second buried layer of the second conductivity type disposed between the third and fourth deep trench isolations; and
an emitter region disposed between the third and fourth deep trench isolations,
wherein the second deep trench isolation is disposed adjacent to the third deep trench isolation.

7. The semiconductor device of claim 6, further comprising:
an epi-layer disposed between the second and third deep trench isolations, and disposed on the high-resistance silicon layer,
wherein no buried layer is disposed between the second deep trench isolation and the third deep trench isolation.

8. A semiconductor device, comprising:
a semiconductor substrate comprising a first conductivity type semiconductor layer;
a high-resistance silicon layer disposed on the first conductivity type semiconductor layer and having a resistance higher than a resistance of the first conductivity type semiconductor layer;
a first buried layer of a second conductivity type disposed on the high-resistance silicon layer and spaced apart from the first conductivity type semiconductor layer;

a second buried layer of the second conductivity type spaced apart from the first buried layer and disposed on the high-resistance silicon layer; and
a first deep trench isolation (DTI) and a second DTI disposed from an upper surface of the semiconductor substrate to the high-resistance silicon layer,
wherein the first buried layer is surrounded by the first DTI and the second DTI.

9. The semiconductor device of claim 8, wherein each of the first DTI and the second DTI comprises a side wall oxide film, a gap-fill insulating film, and an air gap, and
wherein the air gap overlaps the high-resistance silicon layer laterally.

10. The semiconductor device of claim 8, wherein a first PN junction is formed by the first conductivity type semiconductor layer and the first buried layer of the second conductivity type, and disposed between the first DTI and the second DTI.

11. The semiconductor device of claim 8, further comprising:
a collector region disposed between the first DTI and the second DTI; and
a lightly-doped well region disposed between the collector region and the first buried layer of the second conductivity type,
wherein the lightly-doped well region and the first buried layer overlap laterally with an air gap of the first DTI or the second DTI.

12. The semiconductor device of claim 11, further comprising:
shallow trench isolation regions disposed adjacent to the collector region; and
a second conductivity type well region disposed below the collector region.

13. The semiconductor device of claim 8, further comprising:
a third DTI and a fourth DTI disposed from the upper surface of the semiconductor substrate to the high-resistance silicon layer; and
an emitter region disposed between the third DTI and the fourth DTI,
wherein the second buried layer is disposed between the third DTI and the fourth DTI, and
wherein the second deep trench isolation is disposed adjacent to the third deep trench isolation.

14. The semiconductor device of claim 13, further comprising:
an epi-layer disposed between the second DTI and the third DTI and disposed on the high-resistance silicon layer,
wherein no buried layer is disposed between the second DTI and the third DTI.

15. A semiconductor device, comprising:
a substrate comprising a lightly-doped semiconductor layer;
a silicon layer disposed on the substrate and having a resistance higher than a resistance of the lightly-doped semiconductor layer;
a highly-doped buried layer disposed on the silicon layer and having a thickness smaller than a thickness of the silicon layer;
an epi-layer disposed on the highly-doped buried layer;
a first deep trench isolation (DTI) and a second DTI spaced apart from each other and disposed across the P-type epi-layer and the silicon layer;
a collector region disposed between the first DTI and the second DTI; and shallow trench isolation regions disposed adjacent to the collector region, a lightly-doped well region disposed between the collector region and the highly-doped buried layer.

* * * * *